United States Patent
Segal (10) Patent No.: US 10,052,858 B2
(45) Date of Patent: Aug. 21, 2018

(54) INTERLOCKING OBJECT CONSTRUCTION UNITS

(71) Applicant: Edo Segal, New York, NY (US)

(72) Inventor: Edo Segal, New York, NY (US)

(73) Assignee: Edo Segal, New York, NY (US)

( * ) Notice: Subject to any disclaimer, the term of this patent is extended or adjusted under 35 U.S.C. 154(b) by 411 days.

(21) Appl. No.: 14/656,597

(22) Filed: Mar. 12, 2015

(65) Prior Publication Data

US 2015/0261910 A1 Sep. 17, 2015

Related U.S. Application Data

(60) Provisional application No. 62/076,224, filed on Nov. 6, 2014, provisional application No. 61/951,945, filed on Mar. 12, 2014.

(51) Int. Cl.

| | |
|---|---|
| *F16B 2/00* | (2006.01) |
| *B32B 41/00* | (2006.01) |
| *B65D 25/52* | (2006.01) |
| *G06F 17/50* | (2006.01) |
| *B23P 19/04* | (2006.01) |
| *B32B 37/00* | (2006.01) |
| *B32B 37/12* | (2006.01) |
| *B32B 37/18* | (2006.01) |
| *B32B 38/00* | (2006.01) |
| *B32B 38/18* | (2006.01) |
| *B32B 39/00* | (2006.01) |
| *B25J 9/16* | (2006.01) |

(Continued)

(52) U.S. Cl.
CPC .............. *B32B 41/00* (2013.01); *B23P 19/04* (2013.01); *B25J 9/1687* (2013.01); *B29C 65/56* (2013.01); *B32B 37/0046* (2013.01); *B32B 37/12* (2013.01); *B32B 37/1207* (2013.01); *B32B 37/18* (2013.01); *B32B 38/0008* (2013.01); *B32B 38/18* (2013.01); *B32B 39/00* (2013.01); *B65D 25/52* (2013.01); *G06F 17/5004* (2013.01); *G06F 17/5086* (2013.01); *B29C 65/485* (2013.01); *B29C 65/4835* (2013.01); *B29C 65/58* (2013.01); *B32B 2037/1246* (2013.01); *G05B 19/4099* (2013.01); *G05B 2219/31044* (2013.01); *G05B 2219/40033* (2013.01); *Y02P 90/04* (2015.11); *Y02P 90/16* (2015.11); *Y02P 90/185* (2015.11)

(58) Field of Classification Search
CPC ...................................... B29C 65/56
USPC ........................................... 428/33
See application file for complete search history.

(56) References Cited

U.S. PATENT DOCUMENTS

| | | |
|---|---|---|
| 4,749,347 A | 6/1988 | Valavaraara |
| 5,121,329 A | 6/1992 | Crump |
| (Continued) | | |

*Primary Examiner* — David T Welch
(74) *Attorney, Agent, or Firm* — Leason Ellis LLP (57) ABSTRACT

The present apparatus relates to a standardized assembly unit for building objects by utilizing connection elements that mechanically attach together permanently. By utilizing particular surface features and characteristics, such as compressive tabs and interlocking structures, the interlocking units described herein are able to impart structural stability to various objects without the need to provide overlapping layers of material or fasteners. More specifically, utilizing only mechanical linkages and connectors, a collection of interlocking units are utilized to assemble complex objects having high strength, durability and permanence.

12 Claims, 7 Drawing Sheets

(51) Int. Cl.
    *B29C 65/56*       (2006.01)
    *G05B 19/4099*    (2006.01)
    *B29C 65/48*       (2006.01)
    *B29C 65/58*       (2006.01)

(56) References Cited

U.S. PATENT DOCUMENTS

| | | |
|---|---|---|
| 5,686,180 A | 11/1997 | Rivlin et al. |
| 7,146,875 B2 * | 12/2006 | Gordy .................... F16C 1/105 |
| | | 74/502.4 |
| 7,799,383 B2 | 9/2010 | Hachikian et al. |
| 2001/0054268 A1 * | 12/2001 | Coleman ................... E04B 2/12 |
| | | 52/604 |
| 2005/0016107 A1 * | 1/2005 | Rosenthal ............... B32B 27/04 |
| | | 52/578 |
| 2006/0054039 A1 | 3/2006 | Kritchman et al. |
| 2006/0059838 A1 * | 3/2006 | Pimental ................... E04B 2/26 |
| | | 52/596 |
| 2007/0006542 A1 * | 1/2007 | Duke ........................ E04B 2/06 |
| | | 52/561 |
| 2008/0109103 A1 * | 5/2008 | Gershenfeld ....... B29C 67/0088 |
| | | 700/119 |
| 2009/0246418 A1 * | 10/2009 | Wise ..................... E01C 13/045 |
| | | 428/17 |
| 2010/0109247 A1 * | 5/2010 | Cernansky ............ A63F 3/0423 |
| | | 273/293 |
| 2011/0123794 A1 * | 5/2011 | Hiller ................. B29C 67/0059 |
| | | 428/221 |
| 2011/0239593 A1 | 10/2011 | Urban et al. |
| 2013/0189028 A1 * | 7/2013 | Gershenfeld ............ F16B 3/00 |
| | | 403/345 |

* cited by examiner

INTERLOCKING OBJECT CONSTRUCTION UNITS

This application claims the benefit of priority under 35 U.S.C. Section 119 of provisional patent application No. 61/951,945 filed on Mar. 12, 2014, entitled "A System and Method for Assembling Objects" and provisional patent application No. 62/076,224 filed on Nov. 6, 2014, entitled "A System and Method for Constructing 3d Objects" each of which is hereby incorporated by reference in its respective entirety.

FIELD OF THE INVENTION

The present invention is directed to an apparatus and method for constructing 3D objects using standardized assembly units according to a specific instruction set. In one particular arrangement, the present invention describes an apparatus configured to assemble or construct an object from a supply of multi-colored assembly units according to an electronic instruction set included along with the supply of standard assembly units. In another arrangement, the invention is directed to constructing an object, such as a toy, from standard assembly units that are permanently bonded or affixed to one another. This permanent bonding characteristic is accomplished by mechanical or chemical adhesion mechanisms.

BACKGROUND OF THE INVENTION

Additive and subtractive manufacturing technologies enable computer designs, such as included in CAD files, to be made into three dimensional (3D) objects. 3D printing, also known as additive manufacturing, typically comprises depositing, curing, fusing, or otherwise forming a loose material into sequential cross-sectional layers of the 3D object.

For example, fused deposition modeling techniques, which are generally disclosed in U.S. Pat. Nos. 4,749,347 and 5,121,329, herein incorporated by reference, describe melting a filament of material and extruding the material out of a dispenser that is moved in the x, y and z-axes relative to a print pad. The material is generally deposited in layers in the x and y axes to form cross-sectional layers that are stacked along the z-axis to form the 3D object.

The prior art uses powders, resins and other substances to additively assemble structures.

However there is no description in the art for assembling objects using a plurality of uniform, discrete assembly units. Furthermore, the art does not describe uniform discrete assembly units having specific color characteristics. Thus, what is needed in the art is an apparatus and method for assembling objects having specific and varied color characteristics without the necessity for painting or otherwise adorning the object after assembly.

Additionally the construction devices and methods describe solve the problem of constructing structurally sound objects from standardized assembly units, especially standardized assembly units of uniform size.

SUMMARY OF THE INVENTION

In certain aspects, the present invention concerns an apparatus and method for assembling objects using standardized assembly units, or voxels. As used herein a "voxel" is a three dimensional assembly unit which operates as a 3-dimensional extension of a 2D pixel, i.e., a volume pixel.

In one particular arrangement, an object such as a toy is constructed using voxels of identical dimensions and features without the need of fasteners or tools. These identical voxels are each includes their own set of vertical connectors and receivers as well as horizontal connectors and receivers. The vertical connectors of one voxel are configured to be secured to the vertical receivers of a second voxel such that a collection of voxels are securely stackable, one on top of the other. Likewise, the horizontal connector of a voxel is configured to be securely connected to the horizontal receiver of a neighboring voxel such that voxels can be securely connected to one another in the horizontal direction.

BRIEF DESCRIPTION OF THE DRAWINGS

The foregoing and other features of the arrangements of the present invention will be more readily apparent from the following detailed description and drawings of an illustrative embodiment of the invention.

DESCRIPTION OF CERTAIN EMBODIMENTS OF THE INVENTION

By way of overview and introduction, the present apparatus and method describe a plurality of commonly sized and permanently interlocking construction units, herein "voxels." The voxel, in one configuration, is used to assemble complex objects and structures. Utilizing particular surface features and characteristics, the voxels are able to impart structural stability to various structures without the need to provide overlapping layers of material or fasteners. More specifically, utilizing only mechanical linkages and connectors, a collection of voxels are used to assemble complex objects.

Figure 1:
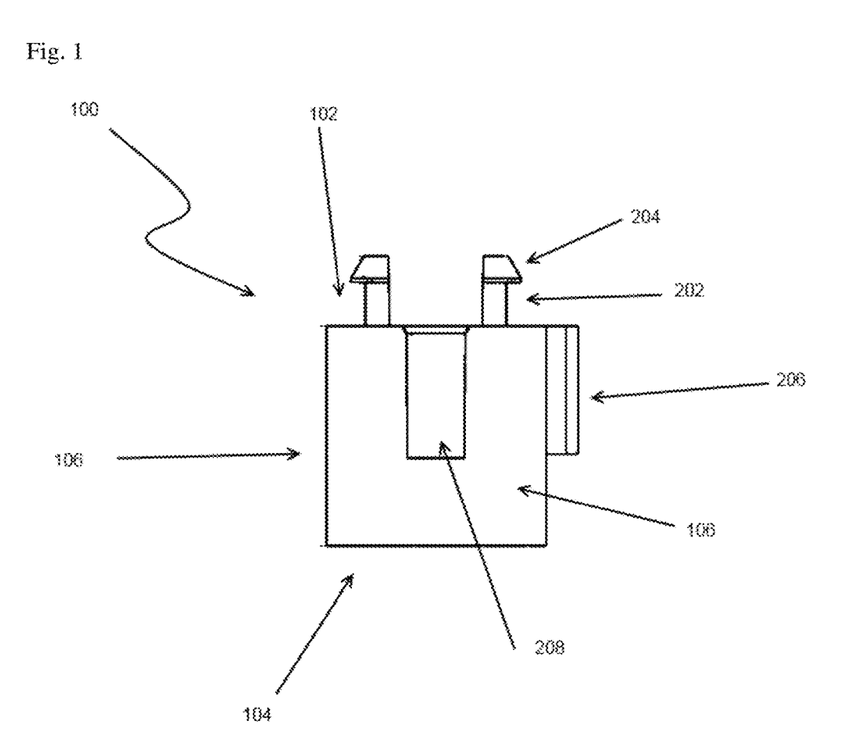
FIG. 1 is a side view of an embodiment of the present invention depicting one assembly object or voxel.

Turning to FIG. 1, provides an example of a single voxel type used to construct objects, such as toys. The voxel includes a top portion 102 and a bottom portion 104, and side portions 106. In the provided arrangement, the voxel is has a substantially square cross section in the horizontal dimension. The voxel 100 is constructed from a single material, such as a plastic, polymer, composite material, synthetic material or other material commonly used to mold or fabricate particular items having the characteristics described herein. As will be appreciated, a plurality of voxels 100 can be manipulated within a 3D printer of suitable construction to produce objects that combined a collection of voxels in a defined manner, including, optionally, with surface modifiers.

In one particular arrangement, the voxels have millimeter scale dimensions. In this configuration, the voxels are used to construct small scale items and objects. Thus, the overall dimensions of the voxels 112 are sufficiently small to allow efficient automated 3D manufacturing techniques.

In an alternative implementation, the voxels have diameters of at least 1 centimeter in size along one dimension (e.g., side) of the voxel 100. Thus, unlike prior art additive and subtractive 3D manufacturing techniques, the invention described uses voxels having prescribed and defined dimensions that allow for individual manual manipulation.

Figure 7:
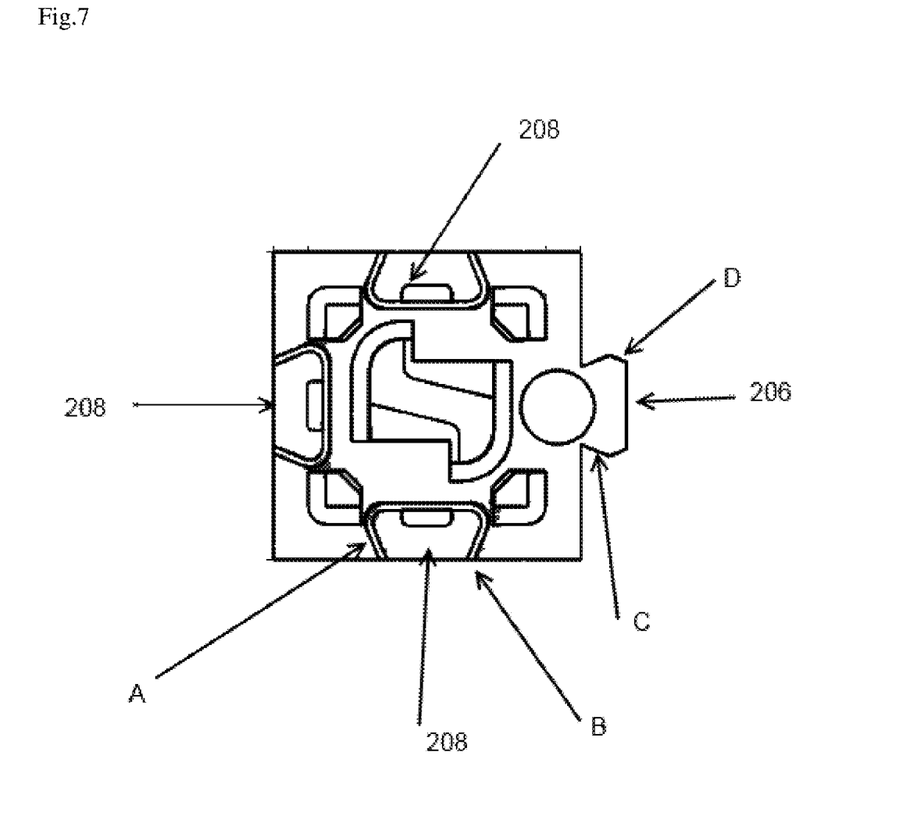
FIG. 7 is a top view of an embodiment of the present invention depicting one assembly object or voxel.

In the substantially square cross-section configuration as illustrated by the top view of FIG. 7, the top portion 102 of the voxel includes at least one vertical securing element or tab 108. As shown in FIG. 1, the vertical securing element 108 is formed of a shaft portion 202 and a flange portion 204. In the particular embodiment provided in the figs, each voxel is equipped with four (4) vertical securing elements arranged around the top portion of the voxel. The shaft portion is provided in sufficient dimensions such that when a force or pressure is applied to the flange portion 204, the shaft portion 202 is configured to flex or bend in response to the force, and to resiliently restore an unflexed or unbent state when the biasing force is removed. In one configuration, the dimensions of the shaft portion 202 are such that the pressure needed to vertically interlock one voxel to another does not exceed material tensile yield of the flange portion 202.

In an alternative configuration, two, three or more vertical securing elements are provided on the top portion. In a further example, the top portion 102 of the voxel 100 is provided with two vertical securing elements. In one specific arrangement, these two vertical securing elements 108 span the substantially the width of the voxel 100. In yet a further embodiment, the vertical securing element is a single structure that spans the perimeter of the top portion of the voxel.

Figure 2:
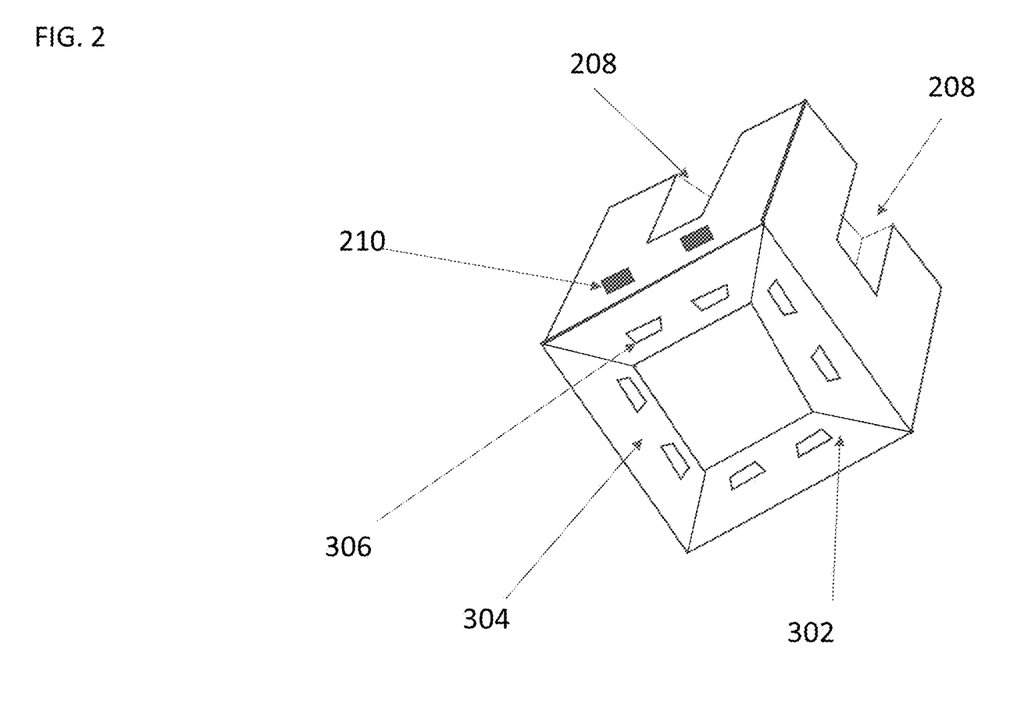
FIG. 2 is an isometric view of the bottom portion of one assembly object according to an embodiment of the present invention.
Figure 3:
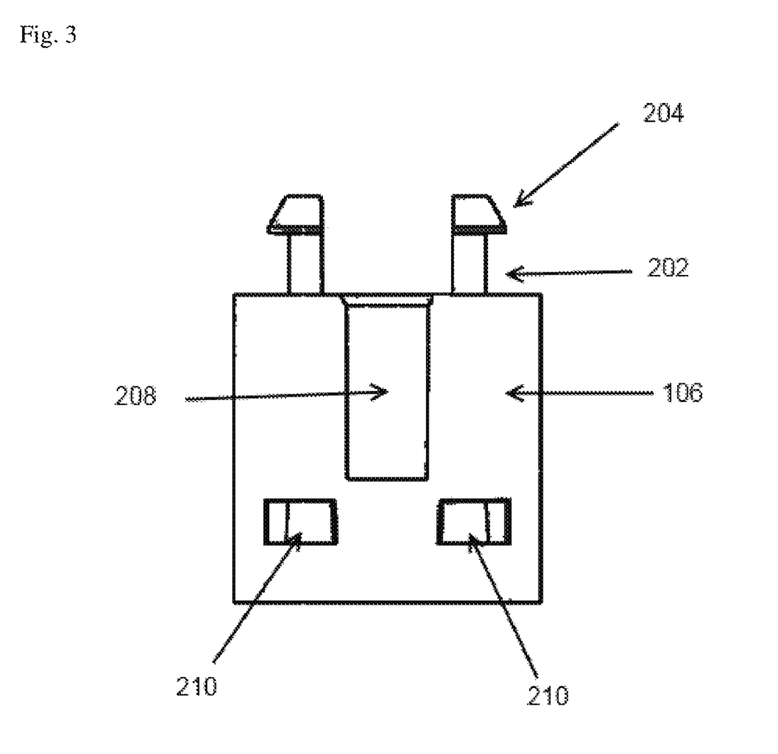
FIG. 3 is an alternate side view of the embodiment of FIG. 1.

The vertical securing elements 108 of a given voxel are configured to interlock with the bottom portion 104 of another voxel that has been moved into a joined connection with that given voxel, such as by a snap-fit or compression fit. As shown in FIG. 2, the bottom portion of the voxel is provided with securing sockets 302 designed to interlock with the vertical securing elements 108 of the voxel below it. In a particular embodiment, the vertical securing sockets 302 work in conjunction with flange securing sockets 210 to secure the flange portion 204 of the vertical securing element 108. Through this arrangement, the flange of the vertical securing element 108 becomes difficult, if not impossible, to de-couple from the vertical socket without permanently deforming or damaging at least one of the voxels. In one configuration, the vertical securing elements are only de-coupled through the use of a specialized tool.

In the illustrated arrangement, the vertical securing elements 108 of a given voxel are deformed inward towards the center of the voxel as it is being vertically interlocked. As pressure is applied to the vertical securing elements, due to the cam surface provided on the flange portion 202, the vertical securing elements are guided by socket slopes 304 to deform away from a rest position in response to the force applied to the cam surface by the socket slopes. Once sufficient pressure has been applied to the interlock the voxels and the flange portion 204 will deform sufficiently to allow the flange portion 204 to pass the arrestor lip 306. Once the arrestor lip 306 has been passed, the native resiliency of the shaft portion of the illustrated embodiment causes the flange portion to return to the rest position, interlocking the voxels together in a substantially permanent manner. As used herein, "substantially permanent" means that the force needed to separate interlocked voxels can, in one configuration exceed the material tensile yield of the voxel material.

Returning to FIG. 1, the side portions of the voxel 100 are provided with a horizontal securing tab 206 and horizontal securing slots 208. In the illustrated embodiment, the voxel is provided with a single horizontal tab 206, and three horizontal securing slots 208. However, in alternative configurations, the voxel can be provided with any combination of horizontal securing slots 208 and horizontal securing tabs 206.

With particular reference to FIG. 7, the horizontal securing slots 208 are configured such that an interior portion of the slot A is sized to have a greater width than the outer portion of the slot B (namely, the mouth). In the example embodiment provided in FIG. 1, the horizontal securing slot 208 is located on the upper portion of the voxel, and the slot does not extend the entire length of the voxel.

The horizontal tab 206 provides a complementary structure to the horizontal securing slot such that the horizontal securing tab 206 is configured with an interior portion C which is sized to have a smaller width than an outer portion D (namely the mouth). Through this configuration, the horizontal securing tab 206 of a given voxel is interlocked to one of the securing slots 208 of a neighboring voxel by sliding the horizontal securing tab 206 vertically into the securing slot so as to align the complementary widths. In a further arrangement, the horizontal securing tab 206 is further provided with additional securing elements, such as further complementary tabs, designed to align with sub-securing slots that are located within the securing slot.

Figure 4:
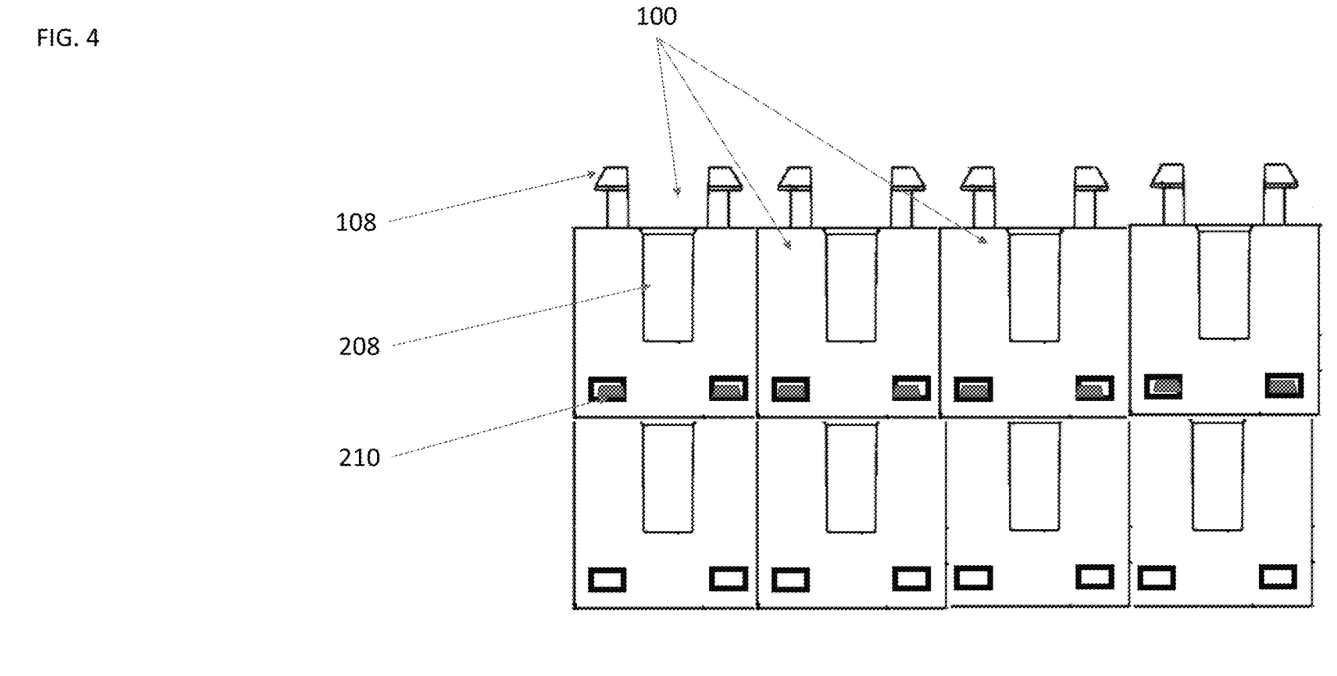
FIG. 4 is a perspective view of a collection of assembly objects joined together in accordance with an aspect of the present invention.

As shown in FIG. 4, vertically and horizontally interlocked voxels of the present embodiment, being generally square-shaped in the horizontal dimension, are flush vertically and horizontally with other another. Through this flush interconnection, the voxels can be used to build objects of increasing complexity without the need for adhesives or fasteners. More importantly, the structures assembled using the single dimension voxels possess structural stability not found in standard interlocking objects. As the example of FIG. 4 illustrates, each of the horizontal tabs interconnects adjacent voxels such that rows of horizontally interconnected voxels are formed. When stacked, this combination of vertical and horizontal interconnections prevents columns or rows of voxels from being able to move independently of adjacent columns. Thus, stable and resilient structures of voxels are constructed free of reliance upon overlapping structures to convey strength. Unlike brickwork, the voxels of the present invention do not have excess material at the edges of structures which require different sized filler material or pieces in order to obtain a flush appearance and uniform edge.

Figure 6:
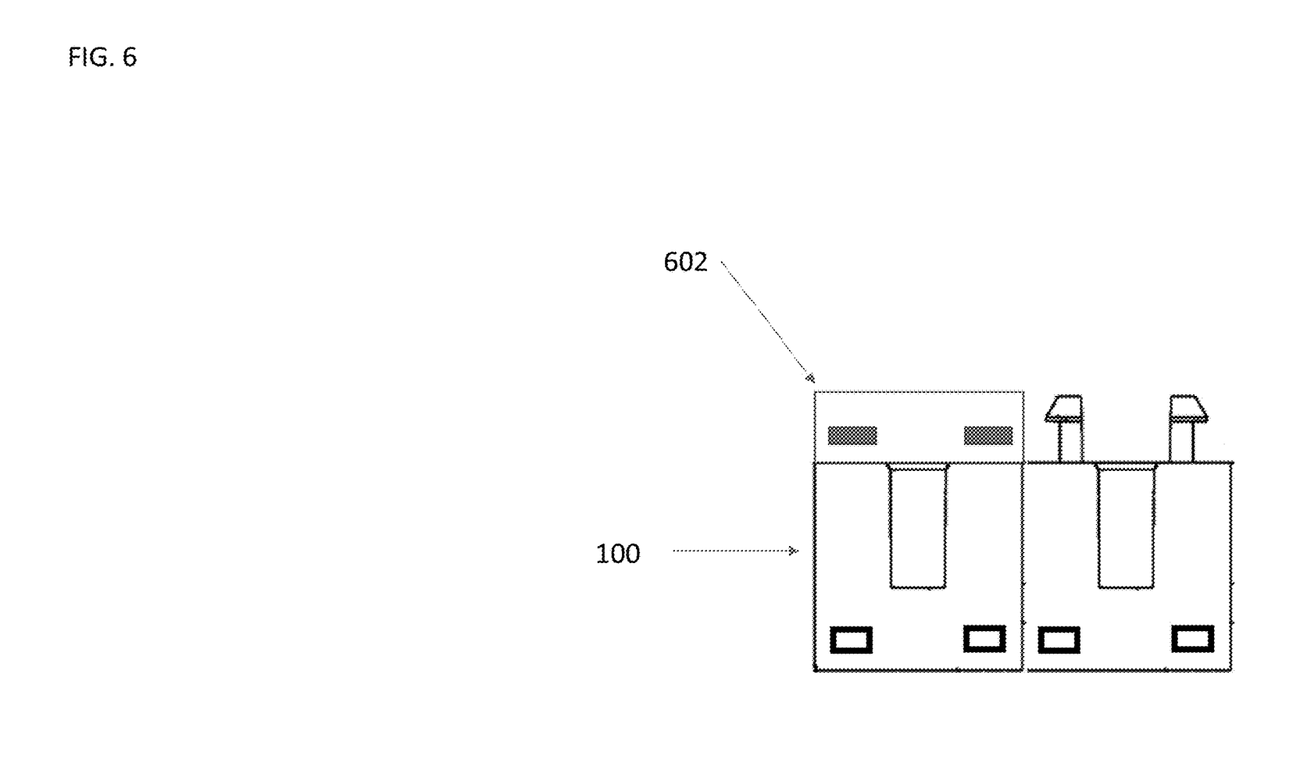
FIG. 6 is a perspective view of a collection of assembly objects joined together in which some of the assembly objects include surface modifier voxels in accordance with still a further aspect of the invention.

However, in a particular implementation, surface attachments can be utilized in order to provide a distinctive visual feature or functionality. In this configuration, a voxel is provided that lacks the top portion connectors and side portion connection. Turning to FIG. 6, surface modifiers voxels 602 are utilized to add features, such as simple mechanical functionality, distinctive decorative elements or colors to a voxel.

In yet a further arrangement of elements, the vertical securing elements, the side securing tabs, the vertical securing sockets and the horizontal securing slots are each provided with electrical and data connectors. In such an arrangement, each voxel can receive electricity and data and convey to further voxels in a connected assembly. In a further arrangement, each voxel or a selection of especially configured voxels is provided with sufficient electronic components to allow for each voxel in a given structure to be addressable by a microprocessor. In a particular configuration, data and electrical signals or power are transmitted from a microprocessor or other data processing device to each, or a select number of addressable voxels having addressable electrical components. In one arrangement, addressable LED components are incorporated into the voxel such that the activation and control of the LED is controlled by a microprocessor remote to the LED containing voxel. In this configuration, signals and power to activate and control the LED are transmitted through the electrical and data connections common to all of the voxels in the structure.

The surface of the voxel 112 can be provided with an adhesive or binding agent. In one possible configuration, the adhesive properties are activated by depositing water vapor onto the surface prior to making contact with another voxel or other structure. In an alternative configuration, the surface adhesive treatment is a curable binding compound activated by direct exposure to electromagnetic energy. In another particular arrangement, the surface adhesive treatment uses infrared or thermal energy to cure the adhesive. In the alternative, the adhesive is cured by exposure to microwave energy. Alternatively, the binding or adhesive agent is composed of two distinct chemical compounds that react with one another to form a bonding agent.

Those skilled in the art will also recognize that in some configurations, individual voxels have a variety of different combinations of mechanical alignment elements, surface adhesion coatings, internal electronic components and connectors. In a further configuration, the voxels 112 have reflective properties that permit the reflection of specific color wavelengths. In one arrangement a voxel 112 is equipped with a coating on at least one surface such that a specific color in the CMYK color scheme is reflected under normal lighting conditions. Alternatively, a voxel 112 is provided where each surface reflects a different color in the CMYK color scheme. In a further arrangement, the voxels 112 each have a single color for covering each surface. Those skilled in the art will appreciate that the CMYK color scheme is provided merely for descriptive purposes and does not limit in any way the applicable surface coating color.

Figure 5:
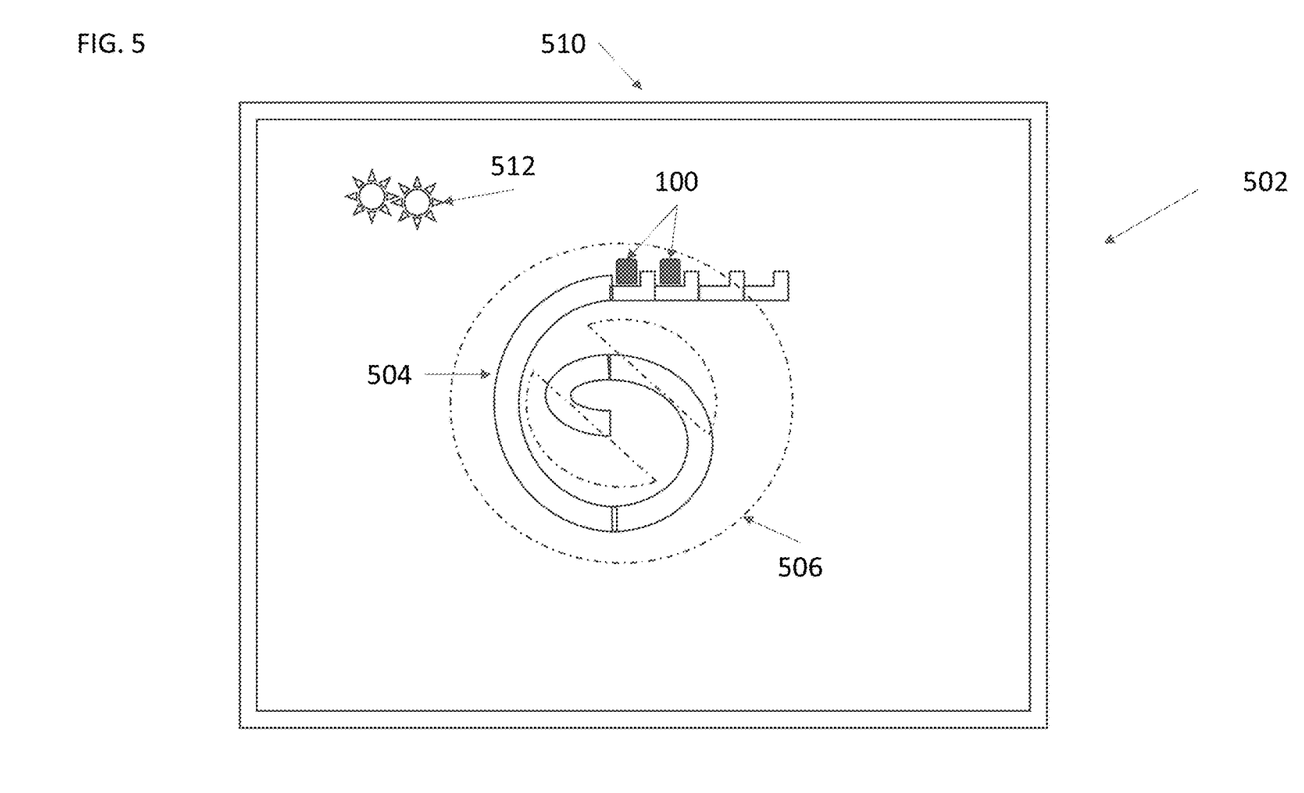
FIG. 5 is an exploded view of a cartridge containing a collection of assembly objects according to a further aspect of the present invention.

As illustrated in FIG. 5 the voxels can be stored in a voxel storage device 502. In accordance with a particular aspect of the present invention, the voxel storage device 502 is a cartridge. In accordance with this aspect, the voxels are secured on a strip 504 wound upon a spool 506 in a cartridge box 510.

By activating gears 512, manually or through an activated motor, the strip of voxels 504 is advanced so as to present a user or 3D printer with additional voxels 100. By reversing this process, a user is able to secure voxels to the strip for storage and retract the strip within the cartridge box for safe keeping. In one arrangement, the action of the gearwheel is controlled by a stepper motor or other microprocessor controlled device such that a precise amount of voxels are provided to the opening for selection. In a further arrangement, a second spool is provided as a take-up wheel to store an empty backing strip and provide tension to the strip 504

In a non-limiting arrangement of the elements described in FIG. 5, the voxel storage 502 is composed of a cartridge containing an unordered collection of voxels 100. In this particular arrangement, voxels 100 in a given cartridge have identical characteristics, such as identical shape and color. In an alternative arrangement, the voxel cartridge is composed of a plurality voxels of different having different characteristics.

In still a further arrangement, the cartridge 502 contains a pre-determined number of voxels that exit from the cartridge in a pre-determined sequence (A, B, C, D, E . . . ). This sequence is related to the instruction steps necessary to construct a desired object. For example, the voxels 100 stored in the cartridge 502 can be arranged such that the first voxel accessible represents the first voxel necessary to assemble a desired object according to an instruction set, such as a human-readable instruction set or a machine-readable instruction set.

In a further arrangement, the described storage device 502 is equipped with a data storage element, or a separate processor (not shown). A processor integral to the cartridge 504 is configured to communicate, via a data link to a computer or other device suitable for relaying instructions to a human user or a mechanical assembly device, such as an assembly machine described in one of the aforementioned applications that have been incorporated by reference. The stored data or instruction set included with the cartridge can, in one arrangement, include a sequence of steps for the construction of a specific object using the voxels 100 in the cartridge 502.

Having described the forgoing voxels as having a square cross section in the horizontal plane, alternative cross sections are also envisioned. For example, a voxel having a hexagonal cross-section and equipped with horizontal and vertical connectors secured on the hexagonal surfaces is also envisioned. In this arrangement a row of n hexagonal voxels is aligned with added horizontal row of n−1 hexagonal voxels providing a staggered surface to a structure.

While this specification contains many specific implementation details, these should not be construed as limitations on the scope of any implementation or of what can be claimed, but rather as descriptions of features that can be specific to particular embodiments of particular implementations. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

It should be noted that use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Particular embodiments of the subject matter described in this specification have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing can be advantageous.

What is claimed:

1. An interlocking assembly object, comprising:
   a top portion, a bottom portion and side portions, wherein the top portion includes at least one vertical securing tab, the bottom portion includes at least one vertical receiving socket, at least one of the side portions includes a horizontal receiver, at least one other side portion is configured with a horizontal securing tab, and at least one side portion including at least one horizontal flange receiving socket in communication with the at least one vertical receiving socket;
   wherein the vertical securing tab further includes a flexible flange having at least one dimension greater than a dimension of the vertical receiving socket so as to be deformed during insertion into a vertical receiving socket of a second interlocking assembly object and returning to its original configuration within a horizontal flange receiving socket of the second interlocking assembly object after insertion into the vertical receiving socket of the second interlocking assembly object;
   wherein at least one of the side portions includes a channel disposed therein, the channel having an interior portion that is wider than a mouth of the channel, and wherein the channel is in communication with the top surface of the interlocking assembly object, and has a length that is less than the length of the at least one side portion in which it is disposed such that the channel is not in communication with the bottom surface of the interlocking assembly object; and
   wherein the horizontal securing tab has an attached portion in communication with the at least one side portion, and an end portion, the attached portion having a width smaller than the mouth of the channel and the end portion having a width larger than the mouth of the channel, and smaller than the width of the interior portion of the channel, wherein the horizontal securing tab has a length that is not more than the length of the channel.

2. The interlocking assembly object of claim 1, wherein the vertical securing tab is configured with a material shaft having a first end connected to the top portion and a second end connected to a material flange having a cross-section greater than the cross section of the material shaft.

3. The interlocking assembly object of claim 2, wherein the vertical receiving socket is further configured with an arresting lip configured to prevent the removal of the material flange upon insertion into the vertical receiving socket.

4. The interlocking assembly object of claim 2, wherein the material flange is compressible when subject to external pressure.

5. The interlocking assembly object of claim 1, wherein the top portion of the interlocking object is configured with at least four vertical securing tabs, and the bottom portion is configured with at least four vertical receiving sockets.

6. The interlocking assembly object of claim 1, wherein the at least one of the vertical securing tab, the vertical receiving socket, the horizontal receiver and the horizontal securing tab is configured with at least one of a data connection and/or an electrical connection.

7. The interlocking assembly object of claim 5, wherein the interlocking assembly object further includes electrical and data connections.

8. The interlocking assembly object of claim 5, wherein the interlocking assembly object further includes an addressable electronic component.

9. The interlocking assembly object of claim 1, wherein the at least one side of the interlocking object is coated with an activated adhesive.

10. The interlocking assembly object of claim 9, wherein the activated adhesive is activated through the application of water onto the surface.

11. The interlocking assembly object of claim 9, wherein the activated adhesive is activated through the application of electromagnetic energy onto the surface of the interlocking assembly object.

12. The interlocking assembly object of claim 9, wherein the activated adhesive is one portion of a binary adhesive formula that is activated upon contact with a complementary compound.

* * * * *